(12) United States Patent
Cheng et al.

(10) Patent No.: US 10,636,842 B1
(45) Date of Patent: Apr. 28, 2020

(54) RESISTIVE RANDOM ACCESS MEMORY AND METHOD FOR FORMING THE SAME

(71) Applicant: Winbond Electronics Corp., Taichung (TW)

(72) Inventors: Chia-Wen Cheng, Hsinchu (TW); Yi-Hsiu Chen, Zhubei (TW); Po-Yen Hsu, New Taipei (TW); Ping-Kun Wang, Tianzhong Township, Changhua County (TW); Ming-Che Lin, Taichung (TW); He-Hsuan Chao, Hsinchu (TW)

(73) Assignee: WINBOND ELECTRONICS CORP., Taichung (TW)

(*) Notice: Subject to any disclaimer, the term of this patent is extended or adjusted under 35 U.S.C. 154(b) by 0 days.

(21) Appl. No.: 16/281,436

(22) Filed: Feb. 21, 2019

(51) Int. Cl.
*H01L 27/24* (2006.01)
*H01L 45/00* (2006.01)

(52) U.S. Cl.
CPC ...... *H01L 27/2463* (2013.01); *H01L 27/2436* (2013.01); *H01L 45/08* (2013.01); *H01L 45/1233* (2013.01); *H01L 45/1246* (2013.01); *H01L 45/1253* (2013.01); *H01L 45/146* (2013.01); *H01L 45/1625* (2013.01); *H01L 45/1675* (2013.01)

(58) Field of Classification Search
CPC ............ H01L 27/2463; H01L 45/1233; H01L 45/1675
See application file for complete search history.

(56) References Cited

U.S. PATENT DOCUMENTS

| 7,463,506 | B2 | 12/2008 | Muraoka et al. |
| 9,716,223 | B1 | 7/2017 | Chen |
| 2008/0170428 | A1 | 7/2008 | Kinoshita |
| 2016/0351623 | A1 | 12/2016 | Chen et al. |
| 2018/0315796 | A1* | 11/2018 | Lee .................... H01L 45/04 |

FOREIGN PATENT DOCUMENTS

| CN | 103579280 B | 12/2015 |
| JP | 2014-017042 A | 1/2014 |
| TW | 201735020 A | 10/2017 |

* cited by examiner

*Primary Examiner* — Daniel P Shook (74) *Attorney, Agent, or Firm* — Muny, Geissler, Olds & Lowe, PC (57) ABSTRACT

A method for forming a resistive random access memory includes forming a layer stack, patterning the layer stack to form a plurality of stack structures, forming a protection layer along sidewalls of the plurality of stack structures, forming a first isolation structure between the plurality of stack structures, forming at least one recess in at least one stack structure to define a plurality of filament units, and forming a second isolation structure in the at least one recess. The layer stack includes a bottom electrode and a resistive switching layer on the bottom electrode.

20 Claims, 10 Drawing Sheets

RESISTIVE RANDOM ACCESS MEMORY AND METHOD FOR FORMING THE SAME

BACKGROUND

Technical Field

The present disclosure relates to semiconductor manufacturing technology, and in particular, it relates to a resistive random access memory and a method for forming the same.

Description of the Related Art

The resistive random access memory (RRAM) has become a major stream of the non-volatile memory currently due to the following advantages: low power consumption, low operation voltage, short write and erase times, long endurance, long data retention time, non-destructive read operation, multi-state memory, being simple to manufacture, and having scalable properties. The basic structure of an RRAM includes a metal-insulator-metal (MIM) stack of a bottom electrode, a resistive switching layer, and a top electrode. When a positive set-voltage is applied to the RRAM, a conduction path may be formed to achieve a low resistance state, which is referred to as an SET process. Furthermore, when a negative reset-voltage is applied to the RRAM, the conduction path may be broken and thus the low resistance state is turned into the high resistance state, which is referred to as the RESET process. In this way, the resistance is controlled using the different polarity of the applied voltage, thereby achieving the purpose of data storage.

Nowadays, due to the high integration of memory chips, the structure of a single memory cell is small enough to be susceptible to cosmic rays and/or alpha particles, which may result in bit flips and data errors, also called soft errors. Therefore, there is an urgent need for further improvements in the soft error of the RRAM.

BRIEF SUMMARY OF THE DISCLOSURE

Some embodiments of the disclosure provide a method for forming a resistive random access memory. The method includes forming a layer stack, patterning the layer stack to form a plurality of stack structures, forming a protection layer along sidewalls of the plurality of stack structures, forming a first isolation structure between the plurality of stack structures, forming at least one recess in at least one stack structure to define a plurality of filament units, and forming a second isolation structure in the at least one recess. The layer stack includes a bottom electrode and a resistive switching layer on the bottom electrode.

Some embodiments of the disclosure provide a resistive random access memory. The resistive random access memory includes a plurality of stack structures and a protection layer along sidewalls of the stack structures. The stack structures are separated from each other by a first isolation structure respectively, wherein each of the stack structures includes a bottom electrode and a plurality of filament units dispose on the bottom electrode. The filament units are physically separated from each other by at least one second isolation structure, and wherein each of the filament units includes a resistive switching structure on the bottom electrode.

A detailed description is given in the following embodiments with reference to the accompanying drawings.

BRIEF DESCRIPTION OF THE DRAWINGS

Aspects of the embodiments of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A to 1E, 1F-1, 1F-2, and 1G to 1I are cross-sectional views illustrating intermediate stages of the manufacturing of the resistive random access memory in accordance with some embodiments.

DETAILED DESCRIPTION OF THE DISCLOSURE

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Although some embodiments are discussed with operations performed in a particular order, these operations may be performed in another logical order. Some of the stages that are described can be replaced or eliminated for different embodiments. Additional operations can be provided before, during, and/or after the stages described in these embodiments. Additional features can be added to the resistive random access memory of the present disclosure. Some of the features described below can be replaced or eliminated for different embodiments.

The resistive random access memory (RRAM) with 1 transistor-1 resistor (1T1R) structure only has one filament unit (that is, the filament transmission channel) in a single memory cell. After the formation of the filament, the RRAM with 1T1R structure has high probability to generate soft error bits during the SET/RESET process. Since the soft error bits are generated randomly and the occurrence probability of the soft error bits is unpredictable, the RRAM with 2 transistors-2 resistors (2T2R) structure is used currently to reduce the soft error bits. The RRAM with 2T2R structure has two filament units in a single memory cell, and the soft error problem may be solved by using a sensing method in conjunction with a combination mode or a differential mode in circuit design. However, the size of the memory cell is thus increased and still exist soft errors.

An exemplary embodiment of the present disclosure provides a resistive random access memory (RRAM) and a method for forming the same, especially a RRAM with 1T1R structure which including multiple filament units in a single memory cell. Since there are multiple filament units in a single memory cell, the number of bits generated by a single memory cell may be improved without increasing the size of the memory cell, thereby reducing the occurrence probability of soft error bits. For example, when the sensing method is used in conjunction with the combination mode, even if the soft error bits may occur in some transmission channels, there are still other transmission channels for processing, and thus the occurrence probability of soft error bits can be decreased.

Figure 1A:
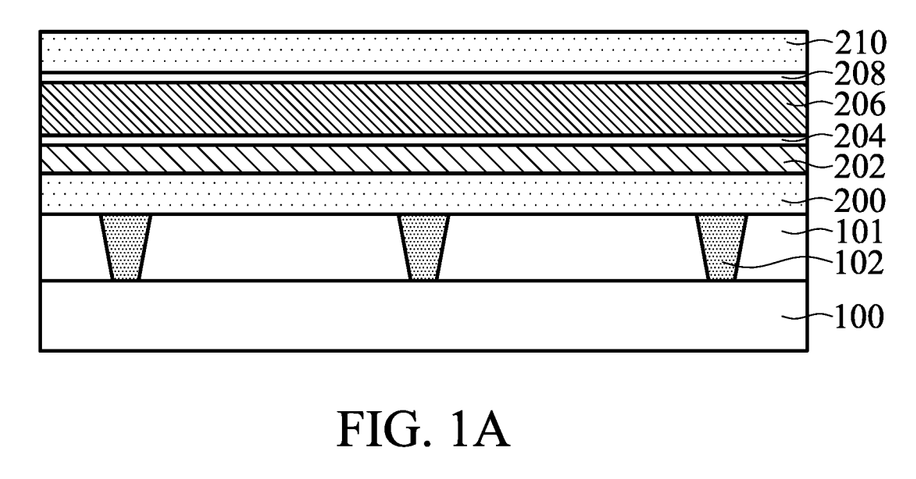

FIGS. 1A to 1I are cross-sectional views illustrating intermediate stages of the manufacturing of the RRAM in accordance with some embodiments. Referring to FIG. 1A, a substrate 100 is provided firstly. The substrate 100 may be a semiconductor substrate, or a silicon-on-insulator (SOI) substrate. For example, the material of the semiconductor substrate may include doped or undoped semiconductor material, such as silicon (Si), germanium (Ge), gallium arsenic (GaAs), silicon carbide (SiC), indium arsenide (InAs), indium phosphide (InP), or the like. Furthermore, the substrate 100 may be formed to include active elements and/or passive elements. The active elements may include transistors, diodes, and the like, and the passives elements may include resistors, capacitors, inductors, and the like. In some embodiments, the substrate 100 may include a memory controlling component (illustrated and described below with respect to FIG. 1I), wherein the memory controlling component includes an active controlling component (for example, a transistor) and interconnection structures (for example, conductive layers, contacts, and the like).

As shown in FIG. 1A, an inter-metal dielectric (IMD) layer 101 is formed on the substrate 100. The inter-metal dielectric layer 101 may be or include oxide (such as silicon oxide, silicon dioxide), nitride, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, silicon carbon material, or a combination thereof. In one embodiment, a thickness of the inter-metal dielectric layer 101 may be about 300 nanometers (nm) to about 400 nm. In addition, the inter-metal dielectric layer 101 is formed with conductive structures 102 therein for connecting the resistive random access memory with the active controlling component and/or the interconnection structures in the substrate 100. In one embodiment, the conductive structures 102 may include aluminum (Al), copper (Cu), tungsten (W), or another applicable conductive material.

Still referring to FIG. 1A, a layer stack is formed on the inter-metal dielectric layer 101. Specifically, the layer stack may include a bottom electrode layer 200, a resistive switching layer 202, a first barrier layer 204, an oxygen exchange layer 206, a second barrier layer 208, and a top electrode layer 210 formed sequentially.

In one embodiment, the bottom electrode layer 200 may include tungsten (W), platinum (Pt), aluminum (Al), titanium (Ti), titanium nitride (TiN), or a combination thereof, and a thickness of the bottom electrode layer 200 may be about 25 nm to about 35 nm. In one embodiment, the resistive switching layer 202 may include transition metal oxide, such as hafnium oxide, titanium oxide, tungsten oxide, tantalum oxide, zirconium oxide, or a combination thereof, and a thickness of the resistive switching layer 202 may be about 3 nm to about 10 nm. In one embodiment, the first barrier layer 204 and the second barrier layer 208 may include aluminium oxide ($Al_2O_3$) or silicon nitride ($SiN_4$) with a thickness about 0.4 nm to about 1 nm. In one embodiment, the first barrier layer 204 is thicker than the second barrier layer 208. In one embodiment, the oxygen exchange layer 206 may include aluminum, titanium, or a combination thereof, and a thickness of the oxygen exchange layer 206 may be about 20 nm to about 40 nm. The bottom electrode layer 200, the resistive switching layer 202, the first barrier layer 204, the oxygen exchange layer 206, the second barrier layer 208, and the top electrode layer 210 for the layer stack may be formed sequentially by E-beam evaporation, sputtering, or physical vapor deposition (PVD).

Figure 1B:
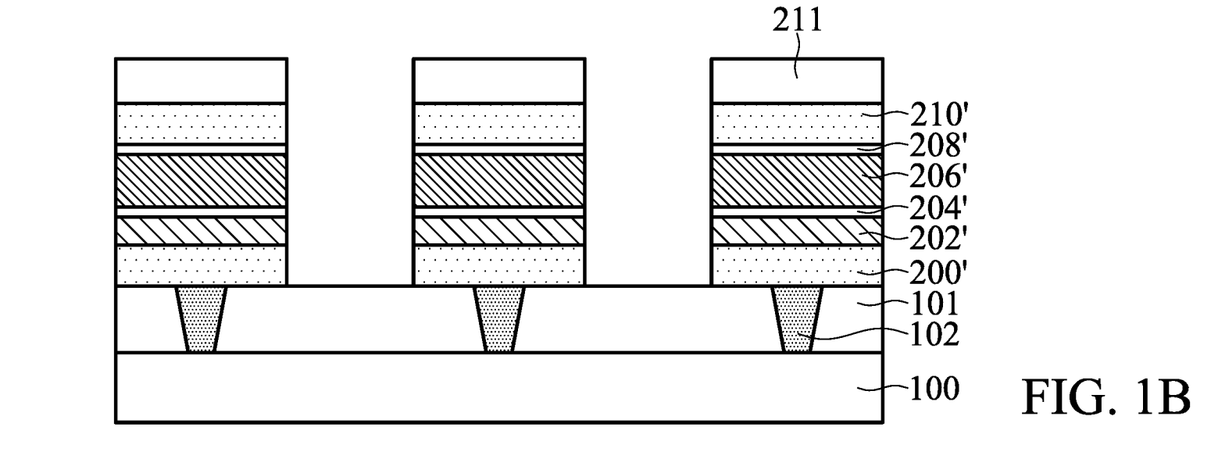

Referring to FIG. 1B, a patterning process is performed on the layer stack to form stack structures corresponding to conductive structures 102 respectively. In particular, a patterned photoresist layer 211 exposing portions of the top surface of the layer stack may be formed on the layer stack. Next, a patterning process is performed on the layer stack by using the patterned photoresist layer 211 to sequentially pattern the bottom electrode layer 200, the resistive switching layer 202, the first barrier layer 204, the oxygen exchange layer 206, the second barrier layer 208, and the top electrode layer 210, thus forming the multiple stack structures on the inter-metal dielectric layer 101. Each of the stack structures is a memory unit. Each of the stack structures includes a bottom electrode 200', a resistive switching layer 202', a first barrier layer 204', an oxygen exchange layer 206', a second barrier layer 208', and a top electrode layer 210' which are sequentially stacked on the inter-metal dielectric layer 101. Then, the patterned photoresist layer 211 may be removed by, for example, an ashing process or a wet strip process.

In one embodiment, a photoresist layer can be formed on the layer stack, such as by using a spin-on coating process, and patterned by exposing the photoresist layer to light using an appropriate photomask. Exposed or unexposed portions of the photoresist layer may then be removed, depending on whether a positive or negative resist is used, to form the patterned photoresist layer 211.

Figure 1C:
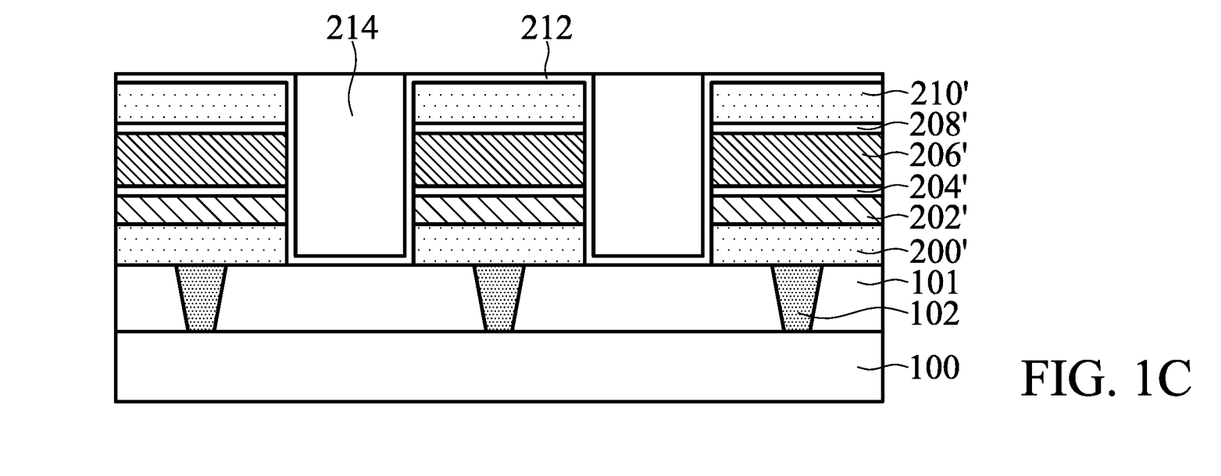

Then, referring to FIG. 1C, a protection layer 212 is formed conformally along sidewalls of the stack structures and the top surface of the stack structures, and first isolation structures 214 are formed between each of the stack structures. In some embodiment, the method for forming the first isolation structures 214 may include forming an insulating material on the substrate 100 blanketly, and then performing a planarization process on the insulating material until the protection layer 212 on the stack structures is exposed to form the first isolation structures 214 between the stack structures (as shown in FIG. 1C). In other embodiments, the planarization process may be performed until the top surfaces of the stack structures are exposed (that is, the top surface of the patterned top electrode layer 210'), and the top surfaces of the stack structures are level with the insulating material (not shown). In some embodiments, the planarization process may include a chemical mechanical planarization (CMP) process or an etch back process. The material of the protection layer 212 and the material of the first isolation structure 214 are different, and the energy band difference between the protection layer 212 and the first isolation structure 214 can prevent electron migration, thereby preventing adjacent memory units from interfering with each other and ensuring the proper functionality of the RRAM. The protection layer 212 may include metal oxide, such as aluminium oxide ($Al_2O_3$), or silicon nitride ($SiN_4$), and a thickness of the protection layer 212 may be about 0.4 nm to about 1 nm. The protection layer 212 may be form by an atomic layer deposition (ALD) process, a chemical vapor deposition (CVD) process, or a combination thereof. As mentioned above, the first isolation structure 214 may be or include insulating material, such as oxide (such as silicon oxide), nitride, or a combination thereof. The insulating material may be filled between the stack structures by a high density plasma chemical vapor deposition (HDP-CVD), a flowable chemical vapor deposition (FCVD), or any applicable deposition process.

Figure 1D:
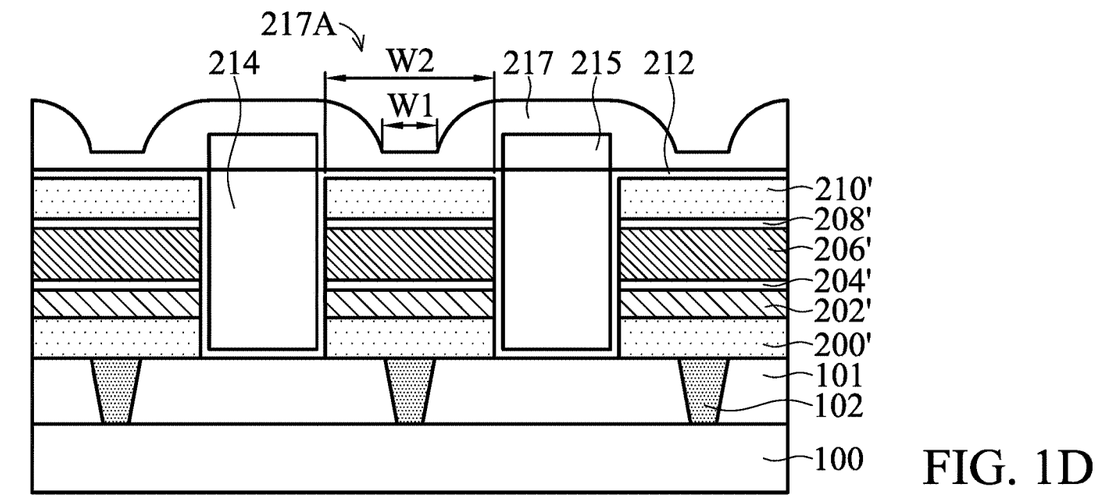

As shown in FIG. 1D, a patterned photoresist layer 215 is formed on the stack structures. In some embodiments, the photomask used for forming the patterned photoresist layer 215 may be the same as the photomask used for forming the patterned photoresist layer 211 in FIG. 1B, so that no extra photomask is needed. For example, a different type photoresist is used to form the patterned photoresist layer 215 having a complementary pattern that is opposite to the patterned photoresist layer 211 in FIG. 1B. In some embodiment, the patterned photoresist layer 211 is a positive photoresist, and the patterned photoresist layer 215 is a negative photoresist. In other embodiments, an extra photomask may be used to form the patterned photoresist layer 215.

Still referring to FIG. 1D, then an insulating layer 217 is formed on the patterned photoresist layers 215 by an applicable deposition process, such as a chemical vapor deposition process or an atomic layer deposition process. In some embodiments, the insulating layer 217 may include or be oxide (such as silicon oxide), nitride, or a combination thereof. As shown in FIG. 1D, the insulating layer 217 has a plurality of recesses 217A, wherein a bottom of the recess 217A has a width W1 and the top surface of the stack structure has a width W2, and wherein the width W1 is in a range of about 1/20 to 3/20 of the width W2.

Figure 1E:
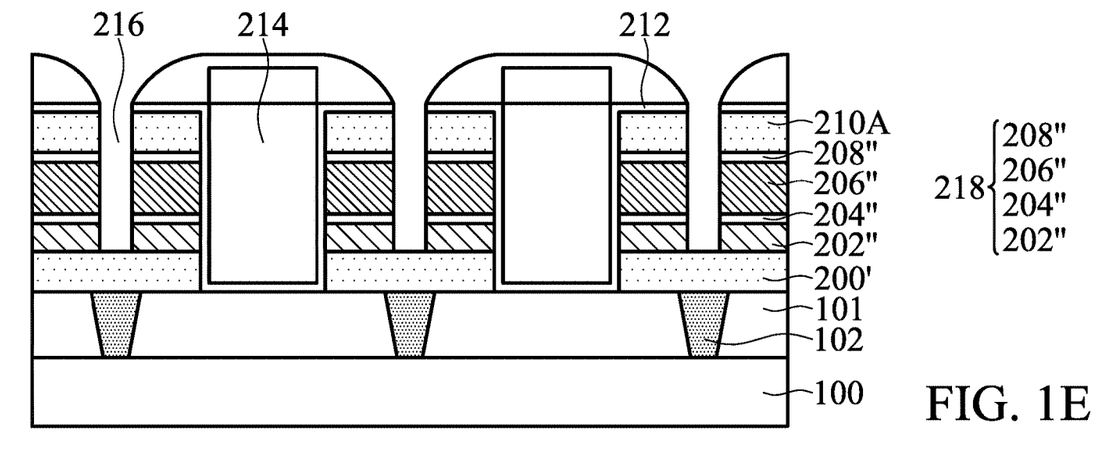

Referring to FIG. 1E, the stack structure is etched to form a recess 216 by using the combination of the patterned photoresist layers 215 and the insulating layer 217 as an etch mask. The recess 216 penetrates through the stack structure to the bottom electrode 200', and exposes a portion of the bottom electrode 200'. The recess 216 defines two physically separated filament units 218 in the stack structure, and defines a plurality of top electrodes 210A, wherein each of the top electrodes 210A is on each of the filament units 218 respectively. As shown in FIG. 1E, the filament unit 218 includes the resistive switching structure 202", the first barrier structure 204", the oxygen exchange structure 206", and the second barrier structure 208". The filament unit 218 is the filament transmission channel. The oxygen exchange structure 206" can help the resistive switching structure 202" to form the filaments. Specifically, after forming the filaments in the resistive switching structure 202", ionized oxygen ions can be stored in the oxygen exchange structure 206". Moreover, the first and second barrier structures 204" and 208" can help to confine the ionized oxygen ions in the oxygen exchange structure 206", and allows more stable filaments formed in the filament units 218 and better filament reproducibility of the resistive random access memory. In some embodiments, the step for etching the stack structures may include any applicable anisotropic dry etching process, such as a reactive ion etching (RIE), a neutral beam etch (NBE), or a combination thereof. Next, the patterned photoresist layers 215 and the insulating layer 217 are removed. For example, the patterned photoresist layers 215 may be removed by, for example, an ashing process or a wet strip process. For example, the insulating layer 217 may be removed by, for example, a wet strip process or an applicable etching process. In some embodiments, the width of the recess 216 is about 1/20 to 3/20 of the width W2 of the stack structure.

Although FIG. 1E illustrates that each of the stack structures only has one recess 216; however, in other embodiments, more than two recesses 216 may be formed in each of the stack structures. In other words, more than three filament units 218 may be defined in each of the stack structures. For example, two recesses 216 may be formed in each of the stack structures to define three filament units 218 in one stack structure.

As shown in FIGS. 1F-1 and 1F-2, second isolation structures 220 are formed in the recesses 216, and an inter-metal dielectric layer 300 is formed on the stack structures. In some embodiments, the second isolation structure 220 may include or be insulating materials, such as oxide (e.g. silicon oxide), nitride, or a combination thereof. In some embodiments, the inter-metal dielectric layer 300 may be or include oxide (such as silicon oxide, silicon dioxide), nitride, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, silicon carbon material, or a combination thereof. In one embodiment, a thickness of the inter-metal dielectric layer 300 may be about 200 nm to about 400 nm.

In some embodiments, as shown in FIG. 1F-1, the second isolation structure 220 and the inter-metal dielectric layer 300 may be formed in the different steps. In this embodiment, the insulating material may be filled in the recesses 216 by any applicable deposition process (such as a high density plasma chemical vapor deposition (HDP-CVD) or a flowable chemical vapor deposition (FCVD)), and the stack structures are covered by excess insulating material. Then, a planarization process (such as a chemical mechanical planarization (CMP) process or a etch back process) may be performed on the insulating material to remove excess insulating material on the stack structures, and the top surface of the stack structures are level with the insulating material, and thus the second isolation structures 220 are formed in the recesses 216. Next, the inter-metal dielectric layer 300 may be formed on the stack structures and the second isolation structures 220 by any applicable deposition process.

In other embodiments, as shown in FIG. 1F-2, the second isolation structure 220 and the inter-metal dielectric layer 300 may be formed in the same deposition process. In this embodiment, the insulating material may be deposited at least on the stack structures by any applicable deposition process to form the inter-metal dielectric layer 300 on the stack structures. In this embodiment, there is no need to use deposition process and/or parameters with high gap-fill capability as compared to the deposition process described in connection with FIG. 1F-1. Therefore, the recesses 216 may not be filled with the insulating material, or only partially filled with the insulating material, to form the second isolation structure 220' with air gap, as shown in FIG. 1F-2. It should be noted that, although the second isolation structures 220 completely fills in the recesses 216 in the structure as illustrated in 1F-1, the second isolation structures 220 may be formed with air gap as well.

Figure 1F:
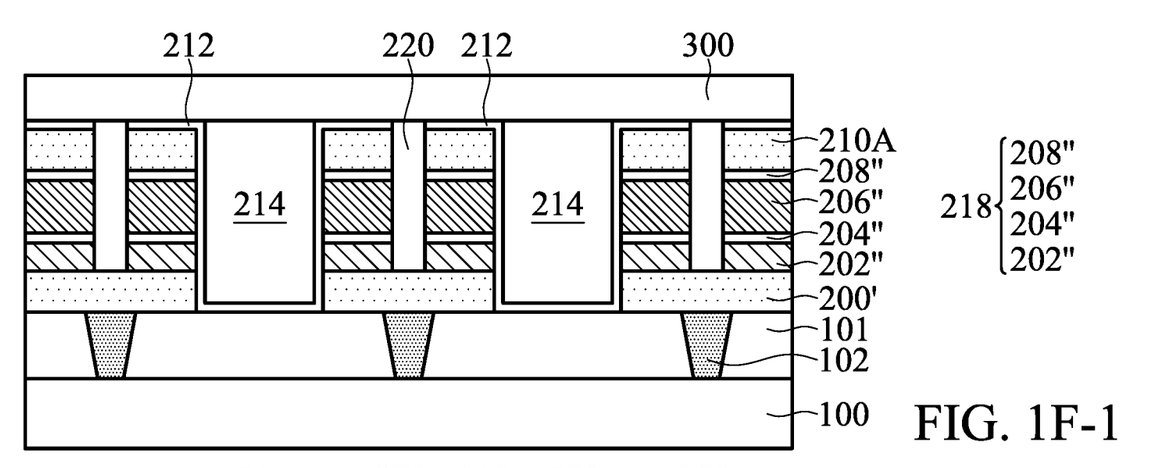
Figure 1F:
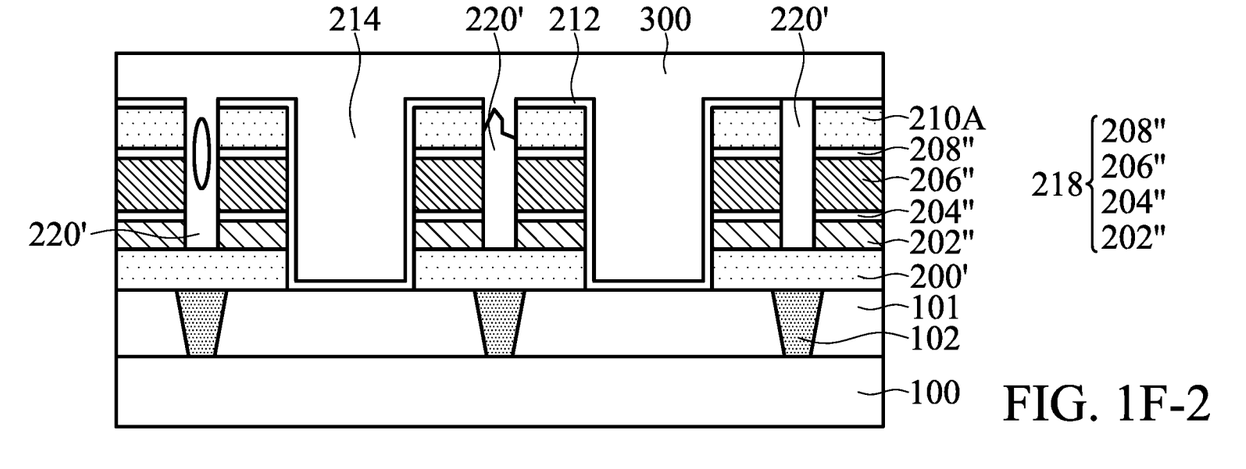
Figure 1G:
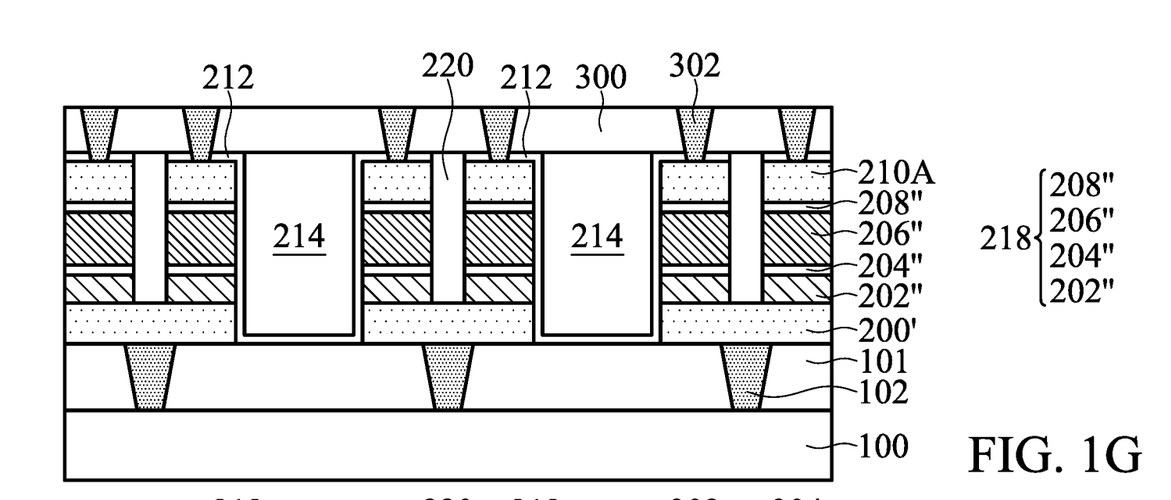

Referring to FIG. 1G, conductive contacts 302 corresponding to the top electrodes 210A are formed through the inter-metal dielectric layer 300 and the protection layer 212. Specifically, openings exposing each of the top electrodes 210A are first formed in the inter-metal dielectric layer 300 and the protection layer 212 by lithography processes and etching processes. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. Next, a planarization process, such as a chemical mechanical planarization, may be performed to remove the liner and the conductive material on the inter-metal dielectric layer 300, and thus the conductive contacts 302 are formed in the openings, as shown in FIG. 1G. In other embodiments, the conductive contacts 302 may be formed by, for example, a damascene process as well.

Figure 1H:
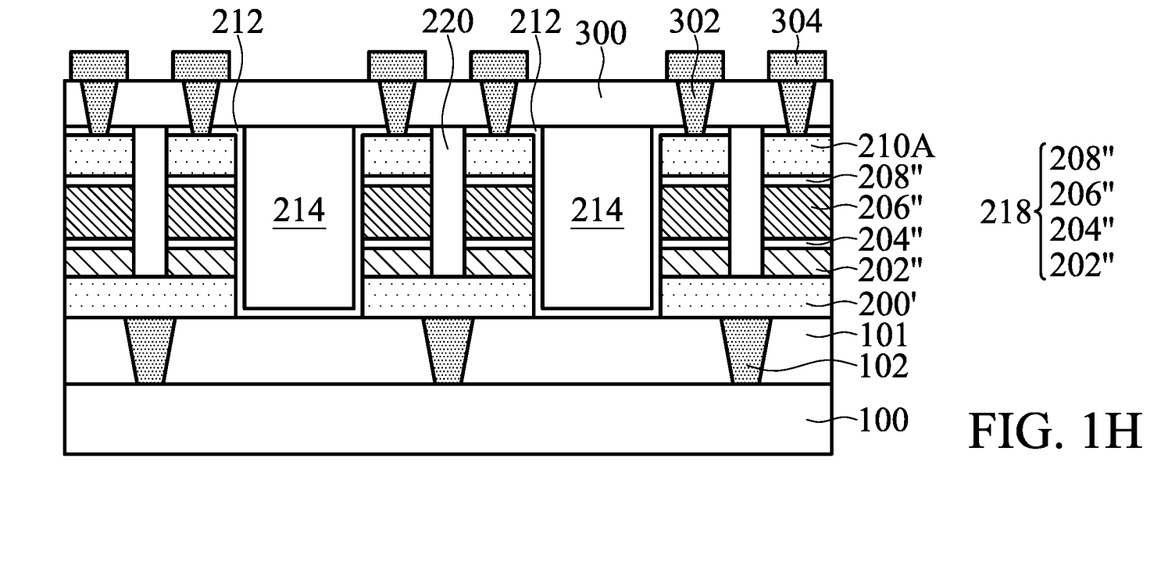

Next, referring to FIG. 1H, multiple conductive layers 304 are formed on the inter-metal dielectric layer 300. In some embodiments, the conductive layers 304 may be formed by a damascene process or a dual damascene process. The conductive layers 304 may be copper, a copper alloy, silver, gold, tungsten, aluminum, nickel, or the like.

Figure 1I:
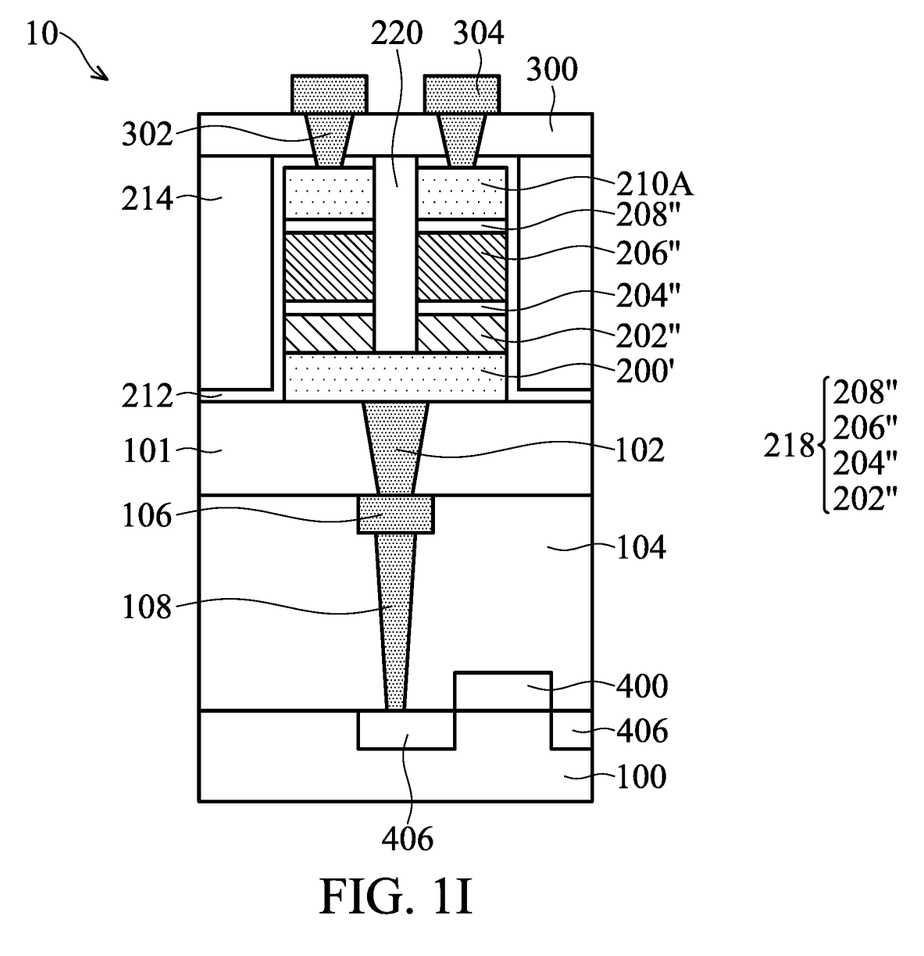

FIG. 1I is an example of the resistive random access memory 10 including controlling components in accordance with some embodiments. As shown in FIG. 1I, besides the structure formed in FIG. 1H, the resistive random access memory 10 further includes a transistor 400 formed on the substrate 100, source/drain regions 406 on the opposite sides of the transistor 400, a dielectric layer 104 between the substrate 100 and the inter-metal dielectric layer 101, a conductive layer 106 and a conductive structure 108 formed in the dielectric layer 104 for electrically connecting the conductive structure 102 with the source/drain regions 406.

In the embodiment described in FIGS. 1A-1I, the resistive random access memory 10 includes a plurality of memory cells, wherein the memory cells are separated from each other by the first isolation structures 214 respectively. Each of the memory cells includes the bottom electrode 200', the plurality of filament units 218 disposed on the bottom electrode 200', the top electrodes 210A respectively formed on each of the filament units 218, the second isolation structure 220, and the protection layer 212 formed along the sidewalls of the bottom electrode 200', the filament units 218, and the top electrodes 210A that are coplanar. The material of the protection layer 212 and the material of the first isolation structure 214 are different, and the energy band difference between the protection layer 212 and the first isolation structure 214 can prevent electron migration, thereby preventing adjacent memory units from interfering with each other and ensuring the proper functionality of the resistive random access memory.

Each of the filament units 218 are physically separated from each other by the second isolation structures 220. Each of the filament units 218 includes the resistive switching structure 202" on the bottom electrode 200', the first barrier structure 204" on the resistive switching structure 202", the oxygen exchange structure 206" on the first barrier structure 204", and the second barrier structure 208" on the oxygen exchange structure 206". Since each of the memory cells has physically separated filament units, multiple bits can be produced without increasing the volume of the memory cell. As a result, the occurrence probability of soft error bits can be decreased when using a sensing method in conjunction with a combination mode/differential mode.

FIGS. 2A to 2G are cross-sectional views illustrating intermediate stages of the manufacturing of the resistive random access memory in accordance with another embodiment. This embodiment is similar to the embodiment of FIGS. 1A to 1I, except that the filament units share one top electrode in this embodiment. For the sake of clarity, elements and processes that are similar or the same will be given the same reference numbers. For the purpose of brevity, the descriptions of these processes and devices are not repeated herein.

Figure 2A:
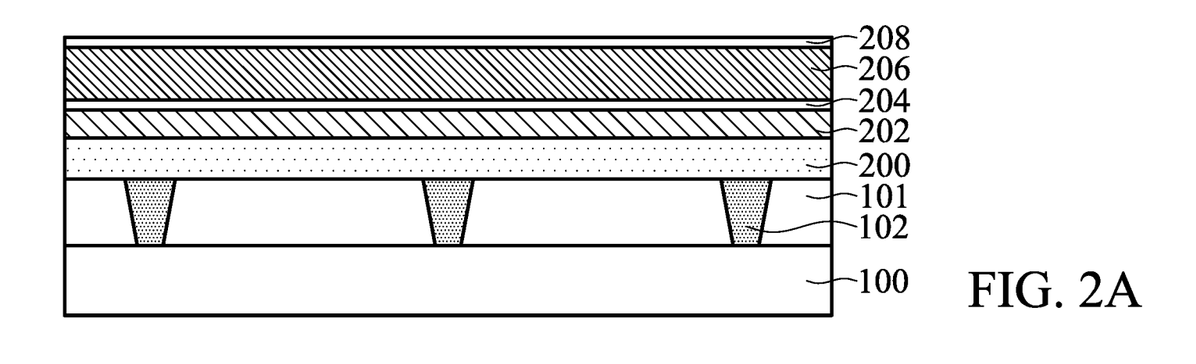
FIGS. 2A to 2G are cross-sectional views illustrating intermediate stages of the manufacturing of the resistive random access memory in accordance with another embodiments.

Referring to FIG. 2A, a substrate 100 is provided initially. Next, an inter-metal dielectric layer 101 is formed on the substrate 100. The inter-metal dielectric layer 101 is formed with conductive structures 102 therein for connecting the resistive random access memory with the active controlling component and/or the interconnection structures in the substrate 100. A layer stack is then formed on the inter-metal dielectric layer 101, and the formation of the layer stack may include sequentially forming a bottom electrode layer 200, a resistive switching layer 202, a first barrier layer 204, an oxygen exchange layer 206, and a second barrier layer 208. The difference between the embodiment of FIG. 2A and the embodiment of FIG. 1A is that the layer stack of this embodiment does not include the top electrode layer 210.

Figure 2B:
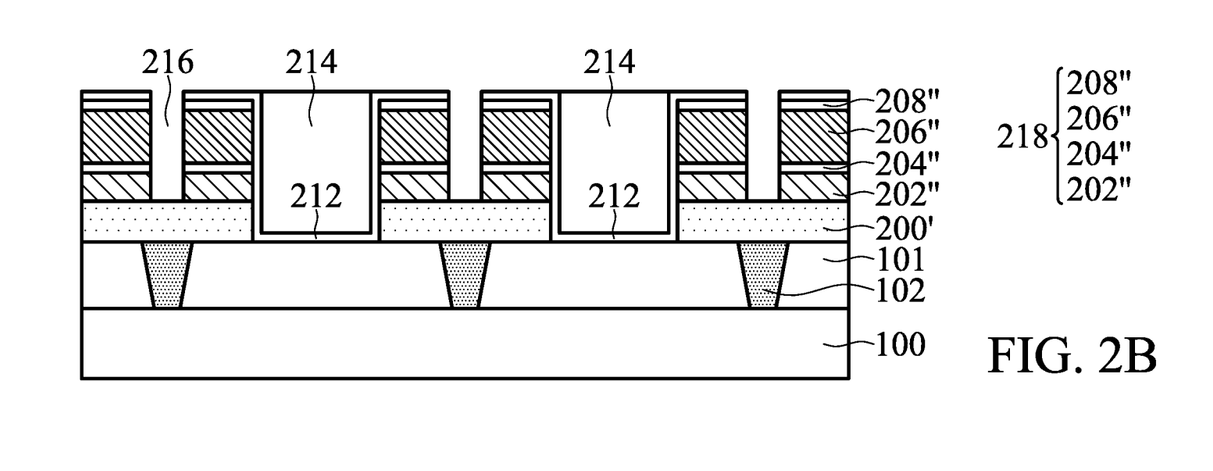

Next, processes as described in connection with FIGS. 1B through 1E are performed to form the structure as shown in FIG. 2B. Referring to FIG. 2B, as mentioned above, the recess 216 defines two physically separated filament units 218 on the bottom electrode 200', and the filament unit 218 includes the resistive switching structure 202", the first barrier structure 204", the oxygen exchange structure 206", and the second barrier structure 208". As shown in FIG. 2B, the protection layer 212 formed along the sidewalls of the bottom electrode 200', the resistive switching structure 202", the first barrier structure 204", the oxygen exchange structure 206", and the second barrier structure 208" that are coplanar, and the protection layer 212 is on the top surface of the second barrier structure 208". In another embodiment, the protection layer 212 only formed along the sidewalls of the bottom electrode 200', the resistive switching structure 202", the first barrier structure 204", the oxygen exchange structure 206", and the second barrier structure 208" that are coplanar, but the protection layer 212 is not on the top surface of the second barrier structure 208" (not shown).

Figure 2C:
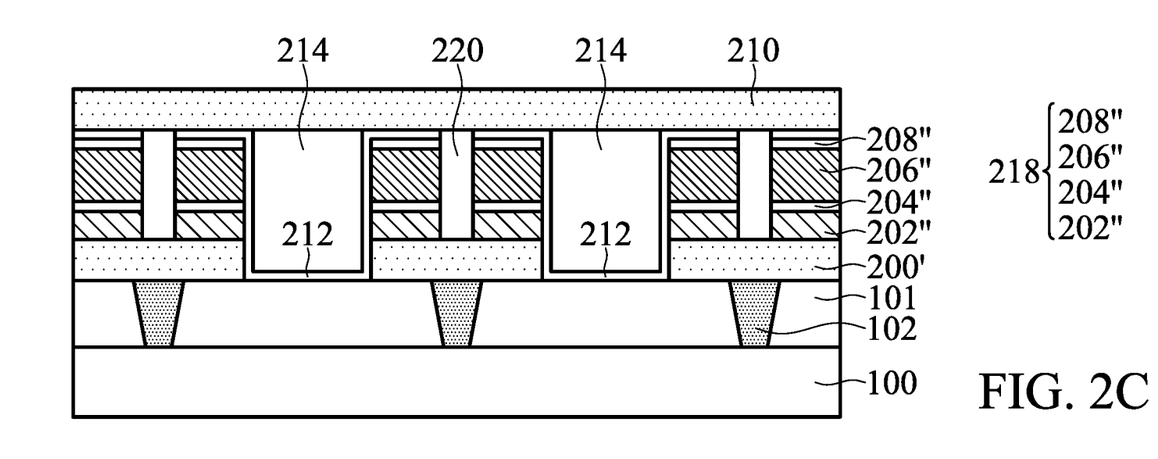

Furthermore, referring to FIG. 2C, second isolation structures 220 are formed in the recesses 216, and a top electrode layer 210 is formed on the filament units 218. The processes and materials for forming the top electrode layer 210 may be similar to the processes and materials described in connection with FIG. 1A, and therefore are not repeated here. The processes and materials for forming the second isolation structures 220 may be similar to the processes and materials described in connection with FIGS. 1F-1 and 1F-2, and therefore are not repeated here. As mentioned above in connection with FIGS. 1F-1 and 1F-2, the second isolation structures 220 may be insulating material (see FIG. 2C), or may be with air gap (not shown). For ease of description, the recesses 218 are illustrated as completely filled with the second isolation structures 220 in FIGS. 2D to 2G.

Figure 2D:
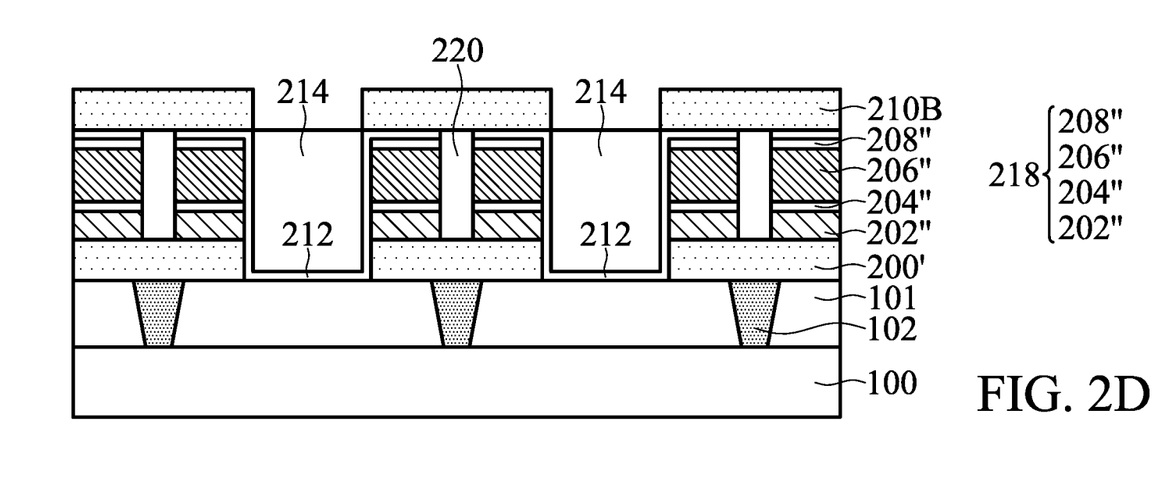

Then, a patterning process is performed on the top electrode layer 210 by an applicable patterned photoresist (not shown) to form a plurality of top electrodes 210B. As shown in FIG. 2D, each of the top electrodes 210B is corresponding to one bottom electrode 200' respectively, and each of the top electrodes 210B covers two filament units 218.

It should be noted that, the photomask used herein may be the same as the photomask used in the step for forming the plurality of stack structures mentioned above, so that no extra photomask is needed. In other embodiments, when a plurality of second isolation structures 220 and a plurality of filament units 218 are formed in one stack structure, the top electrode 210B covers a plurality of filament units 218 simultaneously.

Figure 2E:
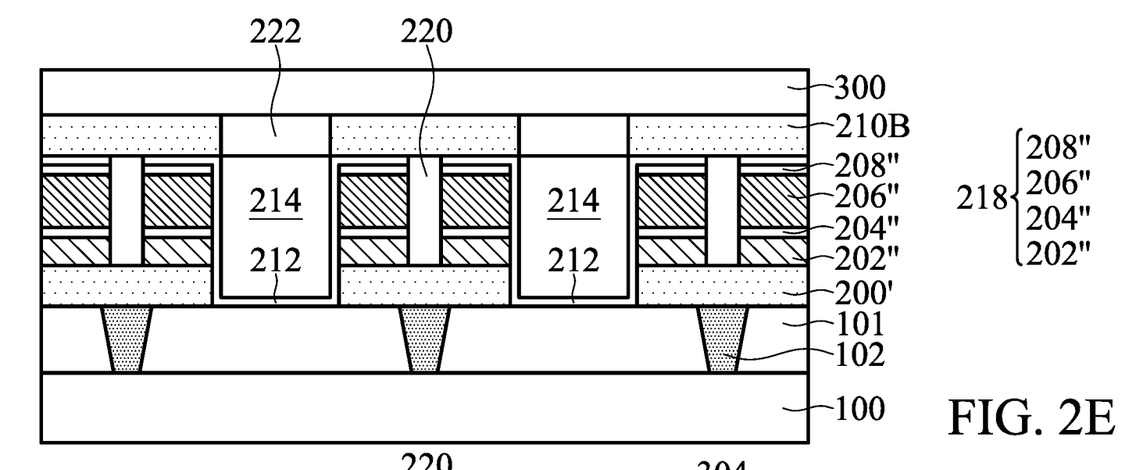

Referring to FIG. 2E, third isolation structures 222 are formed between the top electrodes 210B, and the inter-metal dielectric layer 300 is formed on the top electrodes 210B. In some embodiments, the third isolation structure 222 may include insulating materials, such as oxide (such as silicon oxide), nitride, or a combination thereof. The processes and materials for forming the inter-metal dielectric layer 300 may be similar to the processes and materials described in connection with FIGS. 1F-1 and 1F-2, and therefore are not repeated here.

In some embodiments, the third isolation structures 222 and the inter-metal dielectric layer 300 may be formed in the different steps. In this embodiment, the insulating material may be filled between the top electrodes 210B by any applicable deposition process (such as a high density plasma chemical vapor deposition (HDP-CVD) or a flowable chemical vapor deposition (FCVD)), and the top electrodes 210B are covered by excess insulating material. Then, a planarization process (such as a chemical mechanical planarization (CMP) process or a etch back process) may be performed on the insulating material to remove excess insulating material on the top electrodes 210B, and the top surfaces of the top electrodes 210B are level with the insulating material, and thus the third isolation structures 222 are formed between the top electrodes 210B. Next, the inter-metal dielectric layer 300 may be formed on the top electrodes 210B by any applicable deposition process.

In other embodiments, the third isolation structures 222 and the inter-metal dielectric layer 300 may be formed in the same step. In this embodiment, the insulating material may be formed blanketly on the substrate 100 to serve as the third isolation structures 222 and the inter-metal dielectric layer 300.

Figure 2F:
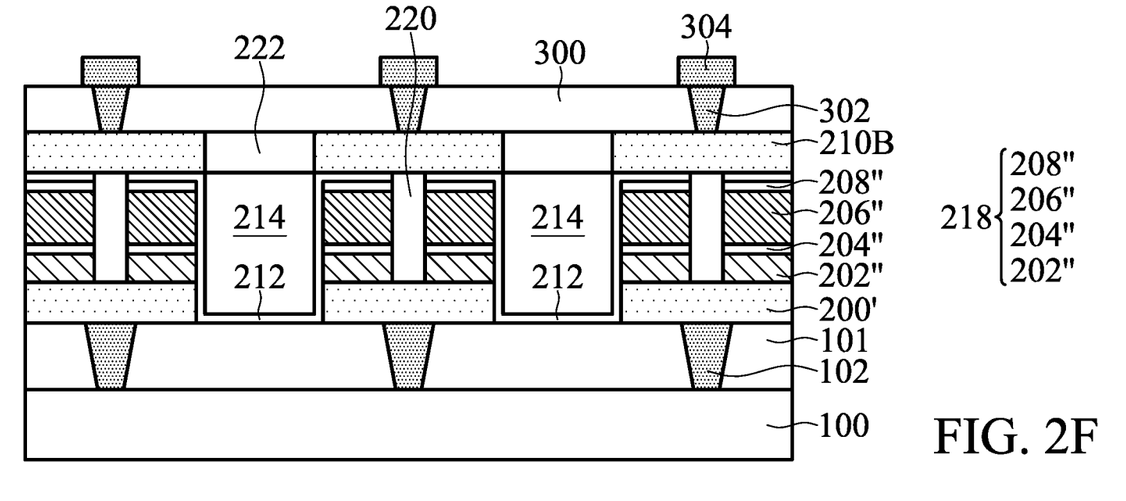

Referring to FIG. 2F, conductive contacts 302 corresponding to the top electrodes 210B are formed through the inter-metal dielectric layer 300. Next, multiple conductive layers 304 are formed on the inter-metal dielectric layer 300. The processes and materials for forming the conductive contacts 302 and the conductive layers 304 may be similar to the processes and materials described in connection with FIGS. 1G and 1H, and therefore are not repeated here.

Figure 2G:
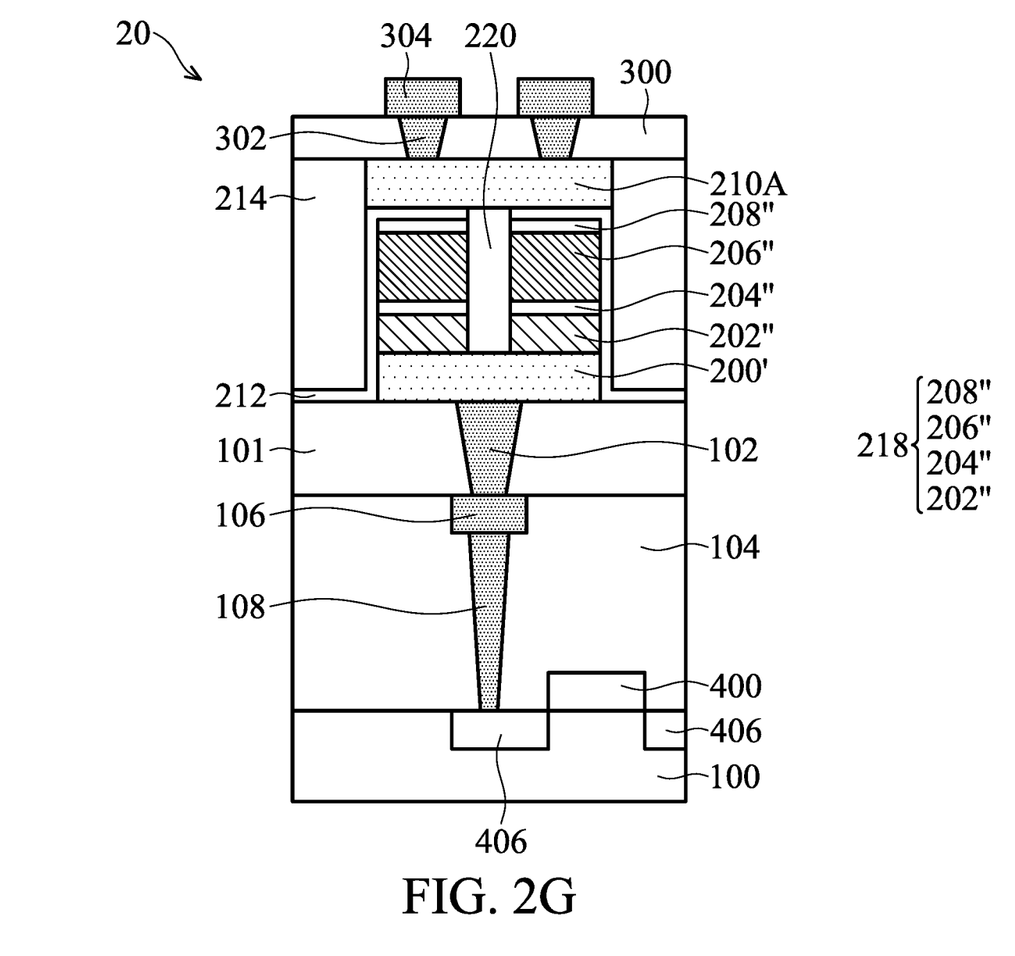

FIG. 2G is an example of the resistive random access memory 20 including controlling components in accordance with another embodiments. This embodiment is similar to the embodiment of FIG. 1I, except that the filament units share one top electrode in this embodiment, and therefore are not repeated here.

In the embodiment described in FIGS. 2A to 2G, the resistive random access memory 20 includes a plurality of memory cells, wherein the memory cells are separated from each other by the first isolation structures 214 respectively. Each of the memory cells includes the bottom electrode 200', the plurality of filament units 218 disposed on the bottom electrode 200', the top electrode 210B covering the plurality of filament units 218, and the protection layer 212 formed along the sidewalls of the bottom electrode 200' and the filament units 218 that are coplanar. The material of the protection layer 212 and the material of the first isolation structure 214 are different, and the energy band difference between the protection layer 212 and the first isolation structure 214 can prevent electron migration, thereby preventing adjacent memory units from interfering with each other and ensuring the proper functionality of the resistive random access memory.

Each of the filament units 218 are physically separated from each other by at least one second isolation structures 220. Each of the filament units 218 includes the resistive switching structure 202" on the bottom electrode 200', the first barrier structure 204" on the resistive switching structure 202", the oxygen exchange structure 206" on the first barrier structure 204", and the second barrier structure 208" on the oxygen exchange structure 206". Since each of the memory cells has physically separated filament units, multiple bits can be produced without increasing the volume of the memory cell. As a result, the occurrence probability of soft error bits can be decreased when using a sensing method in conjunction with a combination mode/differential mode.

Although the embodiments illustrated in FIGS. 1A to 1I and FIGS. 2A to 2G show that the plurality of filament units 218 share one bottom electrode; however, in other embodiments, each of the filament units 218 may be in physical contact with one independent bottom electrode. In other words, the plurality of filament units 218 in one memory cell may be in physical contact with independent top electrodes/a common bottom electrode, a common top electrode/a common bottom electrode, a common top electrode/independent bottom electrodes (not shown), or independent top electrodes/independent bottom electrodes (not shown).

The RRAM shown in FIGS. 1I and 2G may be applied to solve the problem of soft error bits of the RRAM with 1T1R structure. Since a plurality of filament units are formed in a single memory cells, multiple bits can be produced without increasing the volume of the memory cell. As a result, the occurrence probability of soft error bits can be decreased when using a sensing method in conjunction with a combination mode/differential mode. Furthermore, there is an energy band difference between the protection layer formed on the sidewalls of the memory cell and the isolation structure between the memory cells, which can prevent adjacent memory units from interfering with each other and ensure the proper functionality of the RRAM.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a resistive random access memory, comprising:
   forming a layer stack, wherein the layer stack comprises:
      a bottom electrode; and
      a resistive switching layer on the bottom electrode;
   patterning the layer stack to form a plurality of stack structures;
   forming a protection layer along sidewalls of the plurality of stack structures;
   forming a first isolation structure between the plurality of stack structures;
   forming at least one recess in at least one stack structure to define a plurality of physically separated filament units; and
   forming a second isolation structure in the at least one recess.

2. The method as claimed in claim 1, wherein the layer stack further comprises:
   a first barrier layer on the resistive switching layer;
   an oxygen exchange layer on the first barrier layer; and
   a second barrier layer on the oxygen exchange layer.

3. The method as claimed in claim 2, wherein the layer stack further comprises a top electrode layer on the second barrier layer, and wherein forming the at least one recess further comprises forming a plurality of top electrodes, and each of the top electrodes is on the respective filament unit.

4. The method as claimed in claim 3, wherein the top electrodes are physically separated from each other.

5. The method as claimed in claim 2, wherein the oxygen exchange layer comprises aluminum, titanium, or a combination thereof.

6. The method as claimed in claim 1, further comprising forming a plurality of conductive layers before forming the layer stack, wherein each of the conductive layers is electrically connected to one of the stack structures.

7. The method as claimed in claim 6, further comprising forming a plurality of transistors before forming the conductive layers, wherein each of the transistors is electrically connected to one of the stack structures by each of the conductive layers.

8. The method as claimed in claim 1, further comprising:
   forming a top electrode structure on each one of the stack structures after forming the at least one recess.

9. The method as claimed in claim 1, wherein the second isolation structure comprises an air gap.

10. The method as claimed in claim 1, wherein a material of the first isolation structure is different from a material of the protection layer.

11. The method as claimed in claim 1, wherein the protection layer comprises aluminium oxide or silicon nitride.

12. The method as claimed in claim 1, wherein the resistive switching layer comprises hafnium oxide, titanium oxide, tungsten oxide, tantalum oxide, zirconium oxide, or a combination thereof.

13. A resistive random access memory, comprising:
   a plurality of stack structures, wherein the stack structures are separated from each other by a first isolation structure, and wherein each of the stack structures comprises:
      a bottom electrode; and
      a plurality of filament units disposed on the bottom electrode, and the filament units are physically separated from each other by at least one second isolation structure, and wherein each of the filament units comprises a resistive switching structure on the bottom electrode; and
   a protection layer along sidewalls of the stack structures.

14. The resistive random access memory as claimed in claim 13, wherein the filament unit further comprises:
   a first barrier structure on the resistive switching structure;
   an oxygen exchange structure on the first barrier structure; and
   a second barrier structure on the oxygen exchange structure.

15. The resistive random access memory as claimed in claim 13, further comprising a plurality of conductive layers, wherein each of the conductive layers is electrically connected to one of the stack structures.

16. The resistive random access memory as claimed in claim 13, further comprising a plurality of transistors, wherein each of the transistors is electrically connected to one of the stack structures by each of the conductive layers.

17. The resistive random access memory as claimed in claim 13, wherein each of the stack structures further comprises a plurality of top electrodes, and each of the top electrodes is on each of the filament units respectively.

18. The resistive random access memory as claimed in claim 13, wherein each of the stack structures further comprises a top electrode on the filament units.

19. The resistive random access memory as claimed in claim 13, wherein the second isolation structure comprises an air gap.

20. The resistive random access memory as claimed in claim 13, wherein a material of the first isolation structure is different from a material of the protection layer.

* * * * *